United States Patent [19]

Furuya et al.

[11] Patent Number: 5,295,115
[45] Date of Patent: Mar. 15, 1994

[54] ADDRESSING SYSTEM FREE FROM MULTI-SELECTION OF WORD LINES

[75] Inventors: Nobuo Furuya; Kei Suda, both of Tokyo, Japan

[73] Assignee: NEC Corporation, Tokyo, Japan

[21] Appl. No.: 945,610

[22] Filed: Sep. 16, 1992

[30] Foreign Application Priority Data

Sep. 17, 1991 [JP] Japan .................. 3-235776

[51] Int. Cl.[5] ............................................ G11C 8/00
[52] U.S. Cl. ...................... 365/230.06; 365/230.08; 365/233
[58] Field of Search .............. 365/230.06, 230.08, 365/233

[56] References Cited

U.S. PATENT DOCUMENTS 5,086,414  2/1992  Nambu et al. .................. 365/233
5,107,465  4/1992  Fung et al. .................. 365/230.06

Primary Examiner—Eugene R. LaRoche
Assistant Examiner—Andrew Tran
Attorney, Agent, or Firm—Sughrue, Mion, Zinn, Macpeak & Seas

[57] ABSTRACT

An addressing system comprises an address buffer unit responsive to a clock signal of a low level for latching an address signal indicative of one of word lines, and maintaining the address signal until the clock signal is shifted to from a high level to the low level again; an address decoder unit coupled with the address buffer unit for selectively driving decoded signal lines; a timing control unit responsive to the clock signal for producing an in-phase timing signal; and a driver unit having a plurality of driver circuits respectively coupled between the decoded signal lines and the plurality of word lines, wherein the plurality of driver circuits are operative to respectively latch logic levels on the associated decoded signal lines when the in-phase timing signal is shifted from the low level to the high level so as to selectively drive the address lines to active level, and maintains all of the word lines in inactive level while the in-phase timing signal remains in the low level, thereby preventing the word lines from multiple selection.

5 Claims, 5 Drawing Sheets

ADDRESSING SYSTEM FREE FROM MULTI-SELECTION OF WORD LINES

FIELD OF THE INVENTION

This invention relates to a semiconductor memory device and, more particularly, to an addressing system incorporated in the semiconductor memory device.

DESCRIPTION OF THE RELATED ART

Referring first to FIG. 1 of the drawings, a typical example of an addressing system largely comprises an address buffer unit 1, an address decoder unit 2, a word line driver unit 3, and a timing control unit 4. External row address bits A0 through Ax are supplied to the address buffer unit 1, and are latched therein in response to a clock signal CLk of low voltage level. In the following description, "low level" corresponds to logic "0" level, and "high voltage level" is equivalent to logic "1" level.

The address buffer unit 1 is coupled through address signal lines A0, CA0, Ax and CAx with the address decoder unit 2, and the address decoder unit 2 is constituted by a plurality of address decoder circuits 21 through 2m selectively coupled with the address signal lines A0, CA0, Ax and CAx. The address decoder circuits 21 through 2m are identical in circuit arrangement with one another, and each of the address decoder circuits 21 through 2m is implemented by a series combination of a NAND gate NA1 and an inverter IV1. The address decoder unit 2 is coupled through decoded signal lines XS1 through XSm with the word line driver unit 3, and the word line driver unit 3 comprises a plurality of word line driver circuits 31 through 3m associated with word lines WL1 through WLm, respectively. All of the word line driver circuits 31 through 3m are identical in circuit arrangement with one another, and each of the word line driver circuits 31 through 3m comprises a series combination of a NAND gate NA2 and an inverter IV2. The timing control unit 4 produces a timing signal TM shifting the voltage level thereof in synchronism with the clock signal CLK. The NAND data NA2 is coupled with the timing control unit 4 as well as with the associated decoded signal line, and is enabled with the clock signal CLK of logic "1" level. The inverter IV2 drives the associated word line to active high voltage level when the external row address bits A0 through Ax are indicative of a row address assigned to the associated word line.

The prior art addressing system thus arranged behaves as follows. Assuming now that the external address bits A0 to Ax are indicative of the address assigned to the word line WL1, the row address bits A0 through Ax are latched with the clock signal CLK of the low voltage level, and the clock signal CLK of the low voltage level disables the NAND gates of the word line driver circuits 31 through 3m. For this reason, all of the word lines WL1 through WLm go down to the inactive low voltage level. The address buffer unit 1 selectively drives the address signal lines A0, CA0, Ax and CAx, and address decoder circuits 21 is responsive to the logic levels on the address signal lines A0, CA0, Ax and CAx. Namely, the NAND gate NA1 shifts the output node thereof to logic "0" level, and the inverter IV1 drives the decoded signal line XS1 to logic "1" level.

When the clock signal CLK goes up to the high voltage level, the address buffer unit keeps the row address bits A0 through Ax, and the timing control unit 4 shifts the timing signal TM to the high voltage level or logic "1" level. Then, the word line driver circuits 31 through 3m are enabled, and the NAND gate NA2 shifts the output node to logic "0" level. As a result, the inverter IV2 drives the associated word line WL1 to the active high voltage level, and the other word line driver circuits keep the associated word lines in the inactive low voltage level.

Users request the manufacturer to speed up the data access, and the time lag in the timing control unit 4 is expected to be designed as small as possible. It is effective against time delay to minimize the time lag with respect to the leading edge of the clock pulse CLK. However, the timing control unit 4 tends to increase time lag to the trailing edge one and a half times longer than the time lag to the leading edge. Assuming now that the duty ratio of the clock signal CLK is 50 per cent, the timing control signal 4 introduces time delay T1 between the leading edge of the clock signal CLK and leading edge of the timing signal TM and time delay T2 between the trailing edge of the clock signal CLK and the trailing edge of the timing signal TM as shown in FIG. 2, and the time delay T2 is one and a half times longer than the time delay T1. In other words, the pulse width of the timing signal TM is prolonged. The row address ADD0 indicated by the row address bits A0 through Ax has been latched before time t1, and one of the row address decoder circuits 21 through 2m drives the associated decoded signal line until time t4. For this reason, the word line assigned the row address ADD0 is driven to the active high voltage level at time t4, and the associated word line driver circuit continues to drive this word line until time t5, because the prolonged timing signal TM remains in the high voltage level. However, the clock signal CLK is recovered from the high voltage level to the low voltage level at time t3, and the address buffer unit 1 latches a new row address bits indicative of a row address ADD1. For this reason, another address decoder circuit drives the associated decoded signal line to the active high voltage level at time t4, and another word line driver circuit drives the word line assigned the row address ADD1 to the active high voltage level at time t4. Then, multi-selection takes place between time t4 and time t5, and, accordingly, the two word lines are in the active high voltage level. Such a simultaneous selection is not desirable, because two data bits are read out from two memory cells respectively coupled with the two word lines. The two data bits on a bit line pair are interfered with each other, and are liable to be destroyed.

SUMMARY OF THE INVENTION

It is therefore an important object of the present invention to provide an addressing system which is free from multi-selection.

To accomplish the object, the present invention proposes to forcibly shift all of address lines while an in-phase timing signal remains in a first level.

In accordance with the present invention, there is provided an addressing system associated with a plurality of address lines respectively assigned addresses, comprising: a) an address buffer unit responsive to a clock signal of a first level for latching an address signal indicative of one of the addresses, and storing the address signal when the clock signal is shifted from the first level to a second level, the address buffer unit maintaining the address signal until the clock signal is shifted to the first level again; b) an address decoder unit coupled with the address buffer unit for selectively driving decoded signal lines; c) a timing control unit responsive to the clock signal for producing an in-phase timing signal; and d) a driver unit having a plurality of driver circuits respectively coupled between the decoded signal lines and the plurality of address lines, the plurality of driver circuits being operative to respectively latch logic levels on the associated decoded signal lines when the in-phase timing signal is shifted from the first level to the second level so as to selectively drive the address lines to active level, the plurality of driver circuits maintaining all of the address lines in inactive level while the in-phase timing signal remains in the first level.

BRIEF DESCRIPTION OF THE DRAWINGS

The features and advantages of the addressing system according to the present invention will be more clearly understood from the following description taken in conjunction with the accompanying drawings in which.

DESCRIPTION OF THE PREFERRED EMBODIMENTS

First Embodiment

Figure 1:
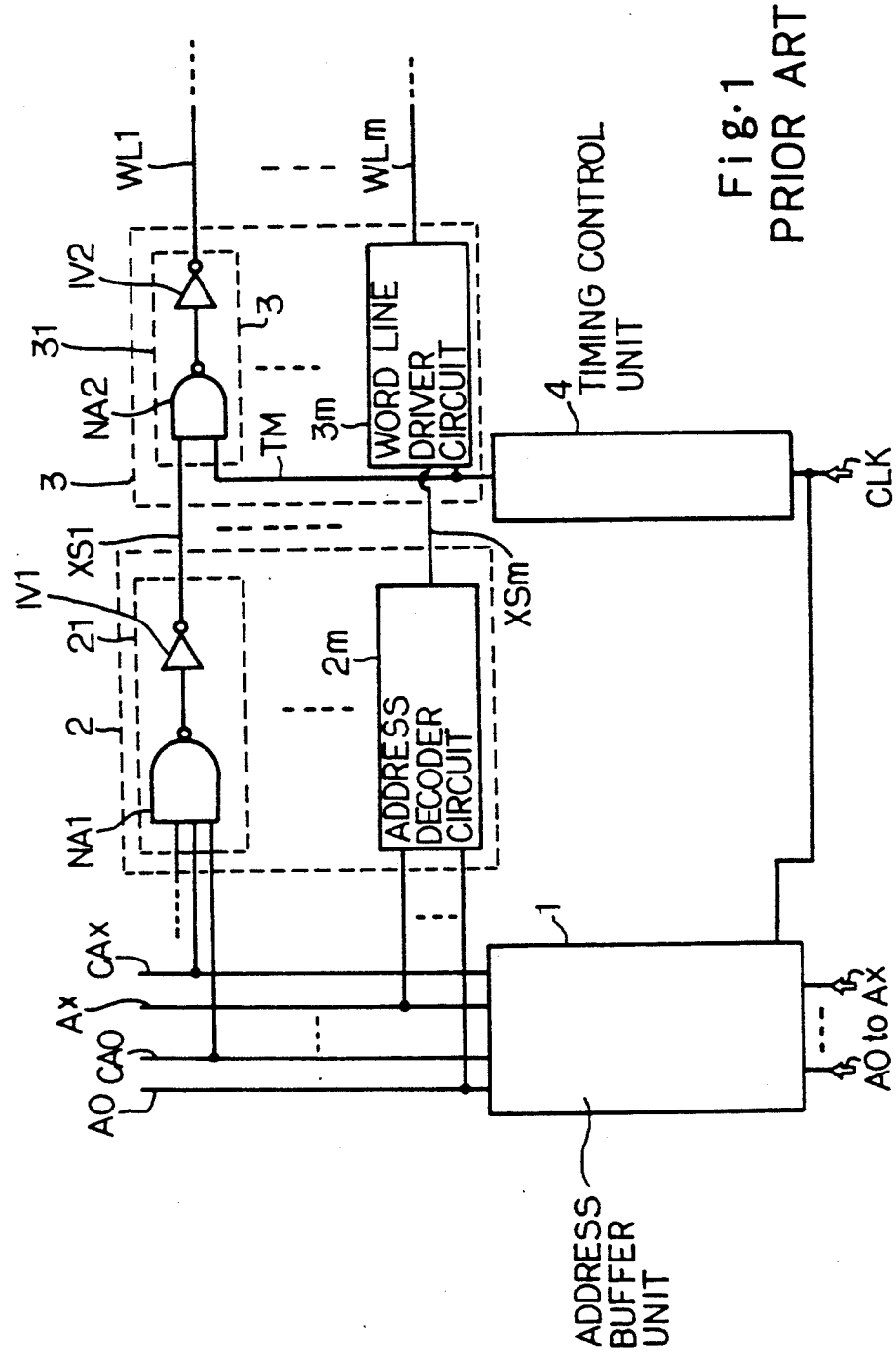
FIG. 1 is a block diagram showing the circuit arrangement of the prior art addressing system.
Figure 2:
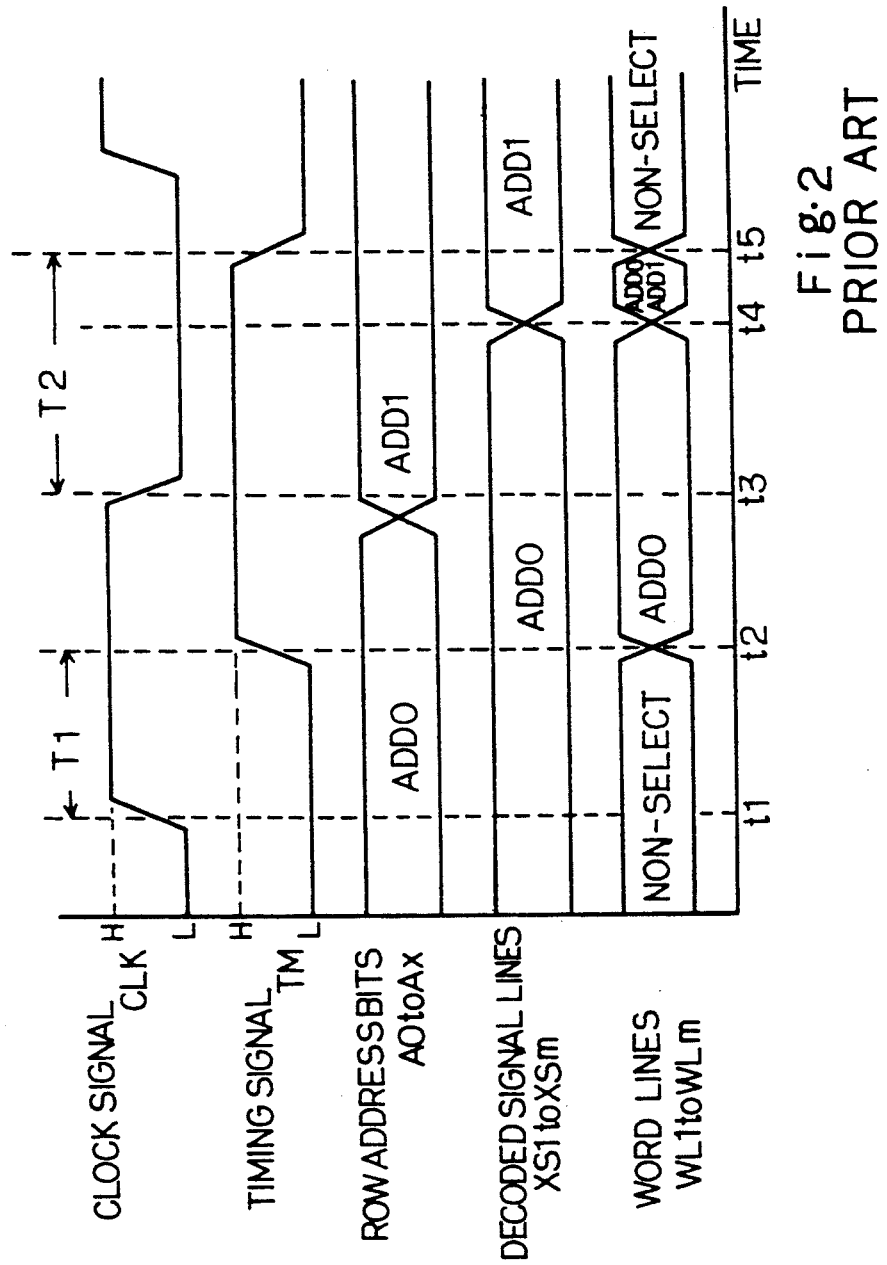
FIG. 2 is a timing chart showing the multi-selection in the prior art addressing system.
Figure 3:
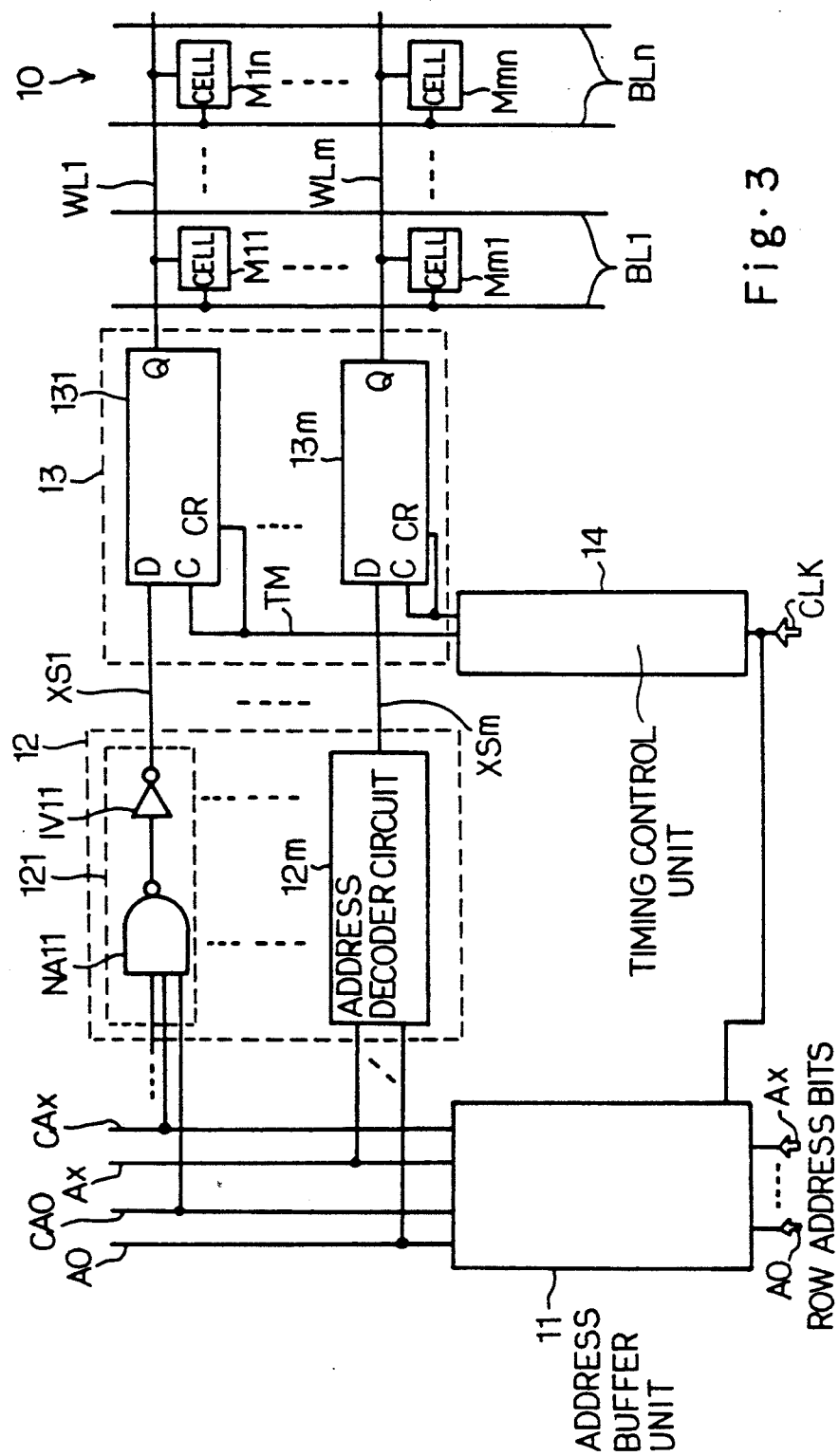
FIG. 3 is a block diagram showing the circuit arrangement of an essential part of a semiconductor memory device equipped with an addressing system according to the present invention.

Referring to FIG. 3, a semiconductor memory device comprises a memory cell array 1, and an addressing system. The memory cell array 1 is constituted by a plurality of memory cells M11, M1n, Mm1 and Mmn arranged in rows and columns, and the addressing system selects a memory cell from the memory cell array 1. A plurality of word lines WL1 to WLm are respectively associated with the rows of the memory cells M11 through Mmn, and row addresses are respectively assigned to the word lines WL1 through WLm. In this instance, the word lines WL1 through WLm serve as address lines. A plurality of bit line pairs BL1 through BLn are further associated with the columns of the memory cells M11 through Mmn, and column addresses are respectively assigned to the bit line pairs BL1 through BLn. With the word lines WL1 through WLm and the digit line pairs BL1 through BLn, one of the memory cells M11 through Mmn is addressable, and a data bit stored therein is accessed.

The addressing system according to the present invention largely comprises an address buffer unit 11, an address decoder unit 12, a word line driver unit 13, and a timing control unit 14. External row address bits A0 through Ax are supplied to the address buffer unit 11, and are latched therein in response to a clock signal CLk of low voltage level. In this instance, the duty ratio of the clock signal CLK is assumed to be 50 per cent. The address buffer unit 11 is coupled through address signal lines A0, CA0, Ax and CAx with the address decoder unit 12, and the address decoder unit 12 is constituted by a plurality of address decoder circuits 121 through 12m selectively coupled with the address signal lines A0, CA0, Ax and CAx. The address decoder circuits 121 through 12m are identical in circuit arrangement with one another, and each of the address decoder circuits 121 through 12m is implemented by a series combination of a NAND gate NA11 and an inverter IV11. The address decoder unit 12 is coupled through decoded signal lines XS1 through XSm with the word line driver unit 13, and the word line driver unit 13 is constituted by a plurality of clocked flip flop circuits 131 through 13m associated with word lines WL1 through WLm, respectively. The clocked flip flop circuit 131, ... or 13m has a data input node D coupled with the associated decoded signal line XS1, ... or XSm, a clocked node C coupled with the output node of the timing control unit 14, a reset node CR also coupled with the output node of the timing control unit 14, and an output node Q coupled with the associated word line WL1, ... or WLm. The timing control unit 14 produces a timing signal TM shifting the voltage level thereof in synchronism with the clock signal CLK, and, accordingly, the timing signal TM is the in-phase signal of the clock signal CLK. The timing control unit 14 introduce longer time lag between the trailing edge of the clock signal CLK and the trailing edge of the timing signal TM rather than the leading edge of the clock signal CLK and the leading edge of the timing signal TM, and, for this reason, prolongs the pulse width of the timing signal TM.

Figure 4:
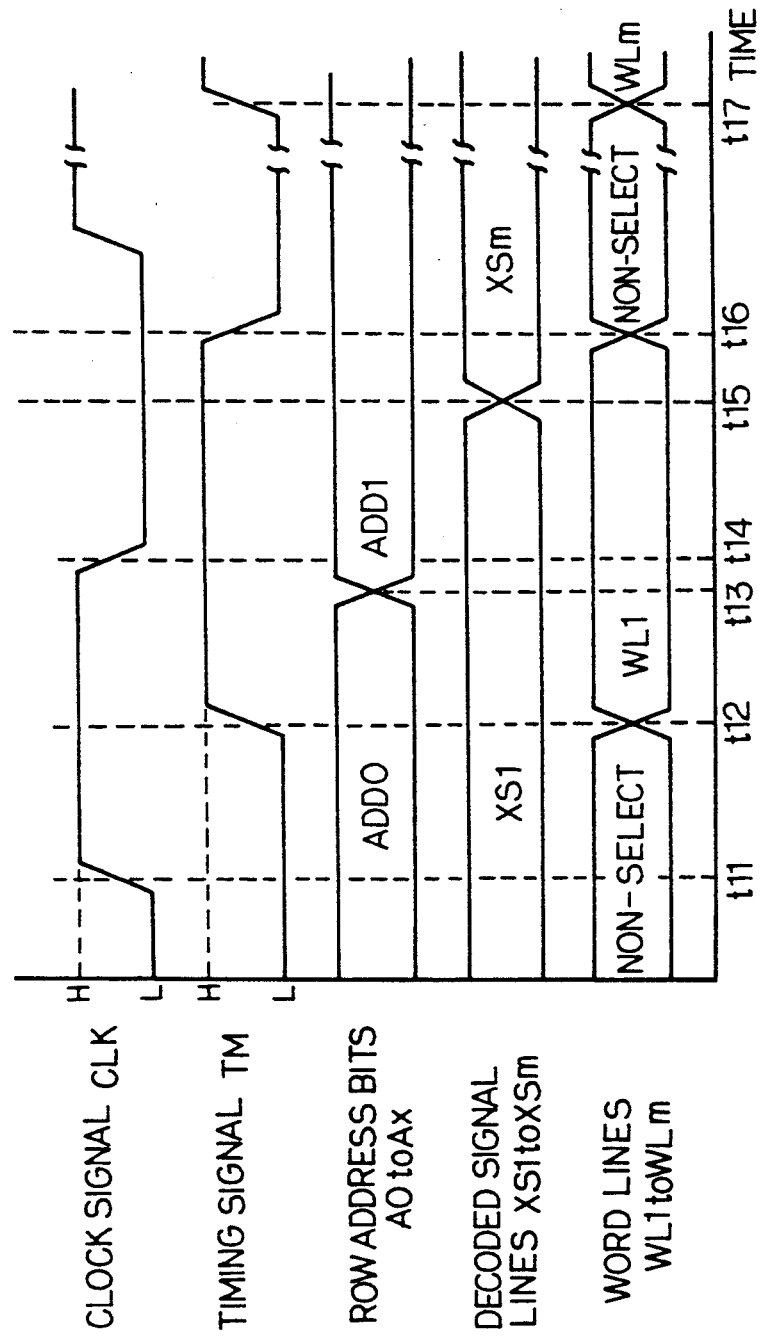
FIG. 4 is a timing chart showing the circuit behavior of the addressing system according to the present invention.

Description is hereinbelow made on circuit behavior of the semiconductor memory device with reference to FIG. 4 on the assumption that row addresses ADD0 and ADD1 are respectively assigned to the word lines WL1 and WLm. The row address bits A0 through Ax are indicative of the row address ADD0 before time t11, and have been latched by the address buffer unit 11. Even if the address decoder circuit 121 has shifted the decoded signal line XS1 to the high voltage level corresponding to logic "1" level before time t11, the clocked flip flop circuit 131 causes the word line WL1 to remain in the inactive low voltage level, because the timing signal TM remains in the low voltage level. At time t12, the timing control signal TM goes up to the high voltage level, and the clocked flip flop circuit 131 shifts the data output node Q and the word line WL1 to the active high voltage level in accordance with the voltage level on the decoded signal line XS1.

The row address bits A0 through Ax are changed and indicates the row address ADD1 at time t13. The new row address ADD1 is latched by the address buffer unit 11 upon pull-down of the clock signal CLK at time t14, and the address decoder circuit 12m shifts the associated decoded signal line XSm to the high voltage level instead of the decoded signal line XS1. However, the timing signal TM of the high voltage level causes the flip flop circuits 131 to 13m to keep the previous voltage level at the output nodes Q thereof, and no multi-selection takes place between time t15 and time t16. At time t16, the timing signal TM goes down to the low voltage level, and all of the clocked flip flop circuits 131 through 13m enter the reset state. As a result, all of the word lines WL1 through WLm go down to the inactive low voltage level. If the timing signal TM goes up to the high voltage level at time t17 again, the clocked flip flop circuit 13m drives the word line WLm to the active high voltage level.

Thus, the addressing system according to the present invention allows all of the flip flop circuits 131 through 13m to enter the reset state before selectively driving the word lines WL1 through WLm, and no multi-selection takes place, thereby preventing the data bits stored in the memory cell array 10 from destruction.

Second Embodiment

Figure 5:
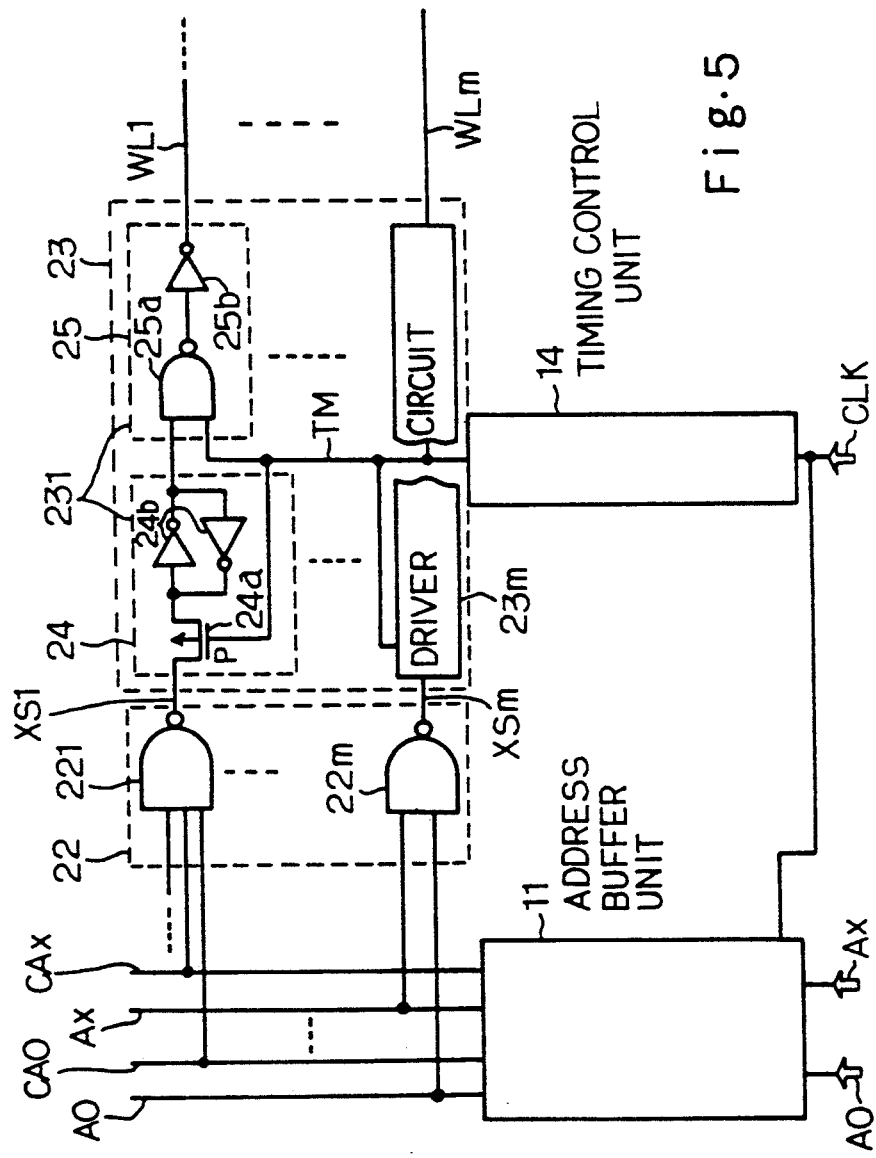
FIG. 5 is a block diagram showing the circuit arrangement of another addressing system according to the present invention.

Turning to FIG. 5 of the drawings, another addressing system embodying the present invention is similar in circuit arrangement to the first embodiment except for an address decoder unit 22 and a driver unit 23, and the other component circuits and signal lines are labeled with the same references designating the corresponding circuits and signal lines of the first embodiment without detailed description for the sake of simplicity.

The address decoder unit 22 is constituted by NAND gates 221 through 22m selectively coupled with the address lines A0, CA0, Ax and CAx, and the driver unit 23 is constituted by a plurality of driver circuits 231 through 23m. All of the driver circuits 231 through 23m are similar in circuit arrangement to one another, and each driver circuit comprises a latch circuit 24 and a logic circuit 25. The latch circuit 24 comprises a p-channel enhancement type transfer transistor 24a, and a flip flop circuit 24b implemented by two inverters, and the timing signal TM is supplied to the gate electrode of the p-channel enhancement type transfer transistor 24a. The logic circuit 25 is implemented by a series combination of a NAND gate 25a and an inverter 25b, and the inverter 25b drives the associated word line. The output node of the latch circuit 24 is coupled with one of the input nodes of the NAND gate 25a, and the timing signal TM is supplied to the other input node of the NAND gate 25a.

The driver circuit 231, ... or 23m thus arranged behaves as follows. While the timing signal TM remains in the low voltage level, the p-channel enhancement type transfer transistor 24a turns on for transferring the logic level on the associated decoded signal line to the associated flip flop circuit 24b, and the NAND gate 25a is disabled so that the associated word line goes down to the inactive low voltage level. On the other hand, if the timing signal TM goes up to the high voltage level, the flip flop circuit 24b is isolated from the associated decoded signal line, and the NAND gate 25a is enabled so as to be responsive to the logic level at the output node of the flip flop circuit 24b.

Thus, the driver unit 23 forcibly shifts all of the word lines WL1 through WLm before selectively driving the word lines WL1 through WLm, and no multi-selection takes place.

Although particular embodiments of the present invention have been shown and described, it will be obvious to those skilled in the art that various changes and modifications may be made without departing from the spirit and scope of the present invention. For example, the addressing system according to the present invention may be available for any type of a semiconductor memory device such as, for example, a dynamic random access memory device, a static random access memory device, a read only memory device and so forth.

What is claimed is:

1. An addressing system associated with a plurality of address lines respectively assigned addresses, comprising:

a) an address buffer unit responsive to a clock signal of a first level for latching an address signal indicative of one of said addresses, and storing said address signal when said clock signal is shifted from said first level to a second level, said address buffer unit maintaining said address signal until said clock signal is shifted to the first level again;

b) an address decoder unit coupled with said address buffer unit for selectively driving decoded signal lines;

c) a timing control unit responsive to said clock signal for producing an in-phase timing signal alternating between said first level to said second level in synchronism with said clock signal; and d) a driver unit having a plurality of driver circuits respectively coupled between said decoded signal lines and said plurality of address lines for selectively driving said plurality of address lines, and coupled with said timing control unit so as to determine a timing for selectively driving said plurality of address lines, said plurality of driver circuits being operative to respectively latch logic levels on the associated decoded signal lines when said in-phase timing signal is shifted from said first level to said second level so as to selectively drive said plurality of address lines to active level, said plurality of driver circuits maintaining all of said address lines in inactive level while said in-phase timing signal remains in said first level.

2. An addressing system as set forth in claim 1, in which each of said plurality of driver circuits is implemented by a flip flop circuit having a data input node coupled with the associated decoded signal line, an data output node coupled with the associated address line, a clock node responsive to said in-phase timing signal of said second level for transferring a logic level on said associated decoded signal line to said associated address line, and a reset node responsive to said in-phase timing signal of said first level for forcibly shifting said data output node to said inactive level.

3. An addressing system as set forth in claim 1, in which each of said plurality of driver circuits comprises a latch circuit responsive to said in-phase timing signal of said first level for storing the logic level on said associated decoded signal line, and isolated from said associated decoded signal line in the presence of said in-phase timing signal of said second level, and a logic circuit coupled between said latch circuit and the associated address line, and enabled with said in-phase timing signal of said second level.

4. An addressing system as set forth in claim 3, in which said latch circuit comprises a transfer transistor coupled with the associated decoded signal line and gated with said in-phase timing signal, and a flip flop circuit coupled between said transfer transistor and said logic circuit.

5. An addressing system as set forth in claim 4, in which said logic circuit comprises a NAND gate having a first input node supplied with said in-phase timing signal and a second input node coupled with said flip flop circuit, and an inverter coupled between said NAND gate and said associated address line.

* * * * *